US012188115B2

(12) United States Patent
Schier et al.

(10) Patent No.: US 12,188,115 B2
(45) Date of Patent: Jan. 7, 2025

(54) COATED CUTTING TOOL

(71) Applicant: WALTER AG, Tubingen (DE)

(72) Inventors: Veit Schier, Echterdingen (DE);
Johannes Kümmel, Reutlingen (DE);
Wolfgang Engelhart, Metzingen (DE)

(73) Assignee: Walter AG, Tubingen (DE)

( * ) Notice: Subject to any disclaimer, the term of this patent is extended or adjusted under 35 U.S.C. 154(b) by 410 days.

(21) Appl. No.: 17/609,018

(22) PCT Filed: May 5, 2020

(86) PCT No.: PCT/EP2020/062370
§ 371 (c)(1),
(2) Date: Nov. 5, 2021

(87) PCT Pub. No.: WO2020/225233
PCT Pub. Date: Nov. 12, 2020

(65) Prior Publication Data
US 2022/0213587 A1    Jul. 7, 2022

(30) Foreign Application Priority Data

May 8, 2019 (EP) ..................... 19173276

(51) Int. Cl.
*C23C 14/06* (2006.01)
*C23C 14/34* (2006.01)
*C23C 14/35* (2006.01)

(52) U.S. Cl.
CPC ...... *C23C 14/0617* (2013.01); *C23C 14/3485* (2013.01); *C23C 14/35* (2013.01)

(58) Field of Classification Search
None
See application file for complete search history.

(56) References Cited

U.S. PATENT DOCUMENTS

| | | | |
|---|---|---|---|
| 4,957,604 A | 9/1990 | Steininger | |
| 2008/0318062 A1* | 12/2008 | Endrino | C23C 14/0664 428/428 |
| 2013/0040119 A1 | 2/2013 | Chen et al. | |
| 2016/0263659 A1* | 9/2016 | Takahashi | C23C 16/06 |
| 2016/0307749 A1 | 10/2016 | Chang et al. | |
| 2018/0216224 A1* | 8/2018 | Stiens | C23C 16/403 |

FOREIGN PATENT DOCUMENTS

EP       3406751 A1 * 11/2018 ........... B23B 27/148

* cited by examiner

*Primary Examiner* — Tamra L. Dicus
(74) *Attorney, Agent, or Firm* — Corinne R. Gorski

(57) ABSTRACT

A coated cutting tool includes a substrate having a coating including a layer of aluminium nitride, which has a phase of aluminium nitride (P). The phase of aluminium nitride (P) has an electron diffraction pattern, wherein up to a scattering vector of $q=8.16$ nm$^{-1}$ there is at least one additional reflection (R) to any reflection found in the cubic and hexagonal aluminium nitride diffraction patterns.

16 Claims, 8 Drawing Sheets

COATED CUTTING TOOL

RELATED APPLICATION DATA

This application is a § 371 National Stage Application of PCT International Application No. PCT/EP2020/062370 filed May 5, 2020 claiming priority to EP 19173276.7 filed May 8, 2019.

The present invention relates to a coated cutting tool having a coating comprising an aluminium nitride layer.

BACKGROUND

There is a continuous desire to improve cutting tools for metal machining so that they last longer, withstand higher cutting speeds and/or other increasingly demanding cutting operations.

Generally, cutting tools for metal machining comprises a substrate of a hard material such as cemented carbide, cubic boron nitride, or cermet, and a thin wear resistant coating deposited on the surface of the substrate.

The coating should ideally have a high hardness but at the same time possess sufficient toughness in order to withstand severe cutting conditions as long as possible.

A coating for a metal cutting tool should also ideally have an as low thermal conductivity as possible since such a property correlates to the heat resistance of a coating.

Aluminium nitride coatings deposited by physical vapour deposition (PVD) are well-known. However, the main application area for an aluminium nitride coating is in the semiconductor industries, while only minor applications as a wear resistant coating in metal cutting are known. The crystal structures of aluminium nitride are cubic (zincblende structure or rock-salt structure) and hexagonal (wurtzite structure).

Reference crystallographic data for cubic aluminium nitride is presented, for example, in Zeitschrift für Physik vol. 22 (1924), pages 201-214. Reference crystallographic data for hexagonal aluminium nitride is presented, for example, Journal of Applied Physics vol. 73 (1993), pages 8198-8200. Also, crystallographic data from powder diffraction analysis are found in ICDD pdf-Nr. 00-046-1200 for cubic aluminium nitride and from ICDD pdf-Nr. 00-025-1133 for hexagonal aluminium nitride.

A cubic aluminium nitride comprises an angle of 90 degrees between lattice planes of the largest lattice plane spacing and a hexagonal aluminium nitride comprises an angle of 60 degrees between lattice planes of the largest lattice plane spacing.

In aluminium nitride deposited by PVD typically the hexagonal phase is found. The wear resistance of hexagonal aluminium nitride is not very good and it is prone to plastic deformation which is why its application in metal cutting is limited. The main use of PVD deposited aluminium nitride as a coating for cutting tools has been as an uppermost layer onto another wear resistant layer of some kind providing lubrication.

The object of the present invention is to provide a coated cutting tool with improved tool life.

THE INVENTION

Figure 1:
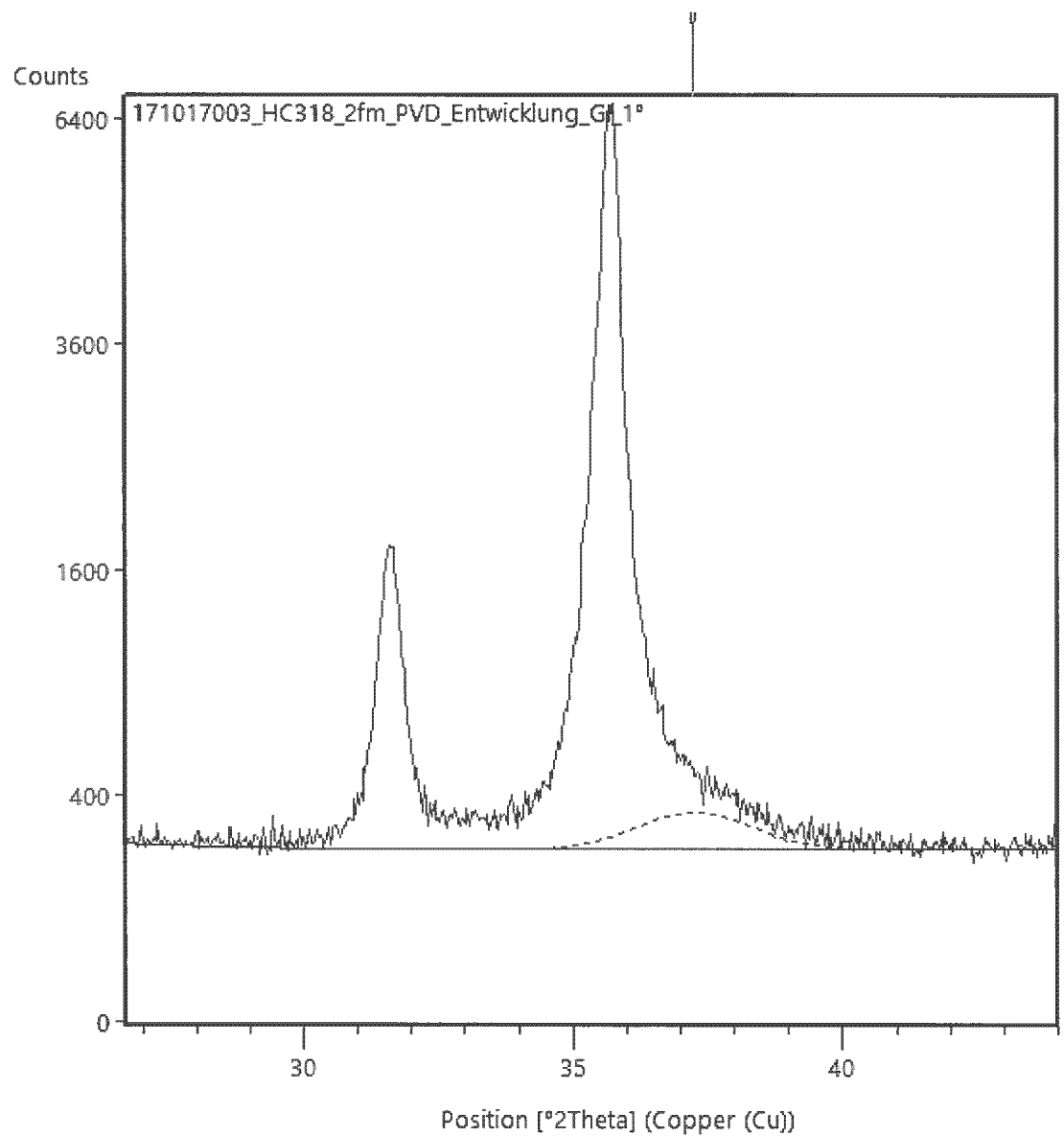
FIG. 1 shows an X-ray 2theta diffractogram for a layer of aluminium nitride according to the invention.

It has now been provided a coated cutting tool comprising a substrate with a coating comprising a layer of aluminium nitride which comprises a phase of aluminium nitride (P), the phase of aluminium nitride (P) shows an electron diffraction pattern wherein up to a scattering vector of $q=8.16$ $nm^{-1}$ there is at least one additional reflection (R) to any one found in the cubic and hexagonal aluminium nitride diffraction patterns.

Thus, the layer of aluminium nitride comprises at least one phase of aluminium nitride which is neither hexagonal nor cubic.

In one embodiment the phase of aluminium nitride (P) in an electron diffraction pattern shows at least one additional reflection (R) originating from a lattice plane spacing of between 2.2 and 2.6 angstrom (Å).

In one embodiment the phase of aluminium nitride (P) in an electron diffraction pattern shows at least one additional reflection (R) originating from a lattice plane spacing of between 1.7 and 1.9 Å.

In one embodiment the phase of aluminium nitride (P) in an electron diffraction pattern shows at least one additional reflection (R) originating from a lattice plane spacing of between 1.3 and 1.5 Å.

In one embodiment the phase of aluminium nitride (P) in an electron diffraction pattern shows at least one additional reflection (R) originating from a lattice plane spacing of between 2.2 and 2.6 Å and at least one additional reflection (R) originating from a lattice plane spacing of between 1.7 and 1.9 Å.

In one embodiment the phase of aluminium nitride (P) in an electron diffraction pattern shows at least one additional reflection (R) originating from a lattice plane spacing of between 2.2 and 2.6 Å and at least one additional reflection (R) originating from a lattice plane spacing of between 1.7 and 1.9 Å and at least one additional reflection (R) originating from a lattice plane spacing of between 1.3 and 1.5 Å.

In electron diffraction analysis the pattern from the phase of aluminium nitride (P) there is in one embodiment a mis-fit to the reference cubic aluminium nitride diffraction pattern and also to the hexagonal diffraction pattern. This mis-fit means that there is a lack of match of the positions of the diffraction spots compared to literature structural data for the cubic or hexagonal crystal structure. This is shown as that some diffraction spots from the reference patterns are missing completely for certain lattice spacings and the angles between diffraction spots of the phase of aluminium nitride (P) from a specific lattice spacing are different than the angles in the reference patterns.

In one embodiment, in the phase of aluminium nitride (P) there are lattice planes of the same lattice plane spacing (d) having an angle between each other of between 40 and 58 degrees, preferably between 46 and 55 degrees, most preferably between 48 and 52 degrees.

In one embodiment one lattice plane spacing (d) corresponds to the innermost spots in the electron diffraction pattern. The lattice plane spacing (d) corresponding to the innermost spots in the electron diffraction pattern is suitably between 2.6 and 2.8 Å.

In one embodiment the lattice plane spacing 1.56 Å of hexagonal aluminium nitride (110 orientation, pdf-Nr. 00-025-1133) is missing in the phase of aluminium nitride (P).

In one embodiment the lattice plane spacing 2.02 Å of cubic aluminium nitride (200 orientation, pdf-Nr. 00-046-1200) is missing in the phase of aluminium nitride (P).

In one embodiment the lattice plane spacing 1.56 Å of hexagonal aluminium nitride (110 orientation, pdf-Nr. 00-025-1133) and the lattice plane spacing 2.02 Å of cubic aluminium nitride (200 orientation, pdf-Nr. 00-046-1200) are missing in the phase of aluminium nitride (P).

The phase of aluminium nitride (P) suitably comprises a lattice plane spacing of between 2.380 and 2.430 Å, preferably between 2.390 and 2.420 Å, the lattice plane spacing is suitably determined from an XRD peak positioned at 2theta between 37 and 39° of the phase of aluminium nitride (P).

In one embodiment, the phase of aluminium nitride (P) has a preferred orientation of the lattice plane spacing of between 2.380 to 2.430 Å, preferably between 2.390 and 2.420 Å, being tilted 50-70° against the surface normal, preferably 55-65° against the surface normal.

The phase of aluminium nitride (P) is suitably present in the form of domains in the layer of aluminium nitride.

The domains of the phase of aluminium nitride (P) is suitably present throughout the layer of aluminium nitride.

The mean size of the domains of the phase of aluminium nitride (P) is suitably less than or equal to 100 Å, preferably less than or equal to 50 Å.

The mean size of the domains of the phase of aluminium nitride (P) is suitably from 10 to 100 Å, preferably from 20 to 50 Å.

The average distance between the domains of the phase of aluminium nitride (P) is suitably from 1 to 100 Å, preferably from 2 to 50 Å, most preferably from 5 to 20 Å.

In the layer of aluminium nitride there are areas delivering a coherent diffraction signal. This can be seen in dark-field TEM. These areas are suitably distributed throughout the layer of aluminium nitride. The mean size of the areas delivering a coherent diffraction signal is suitably from 50 to 500 nm, preferably from 75 to 300 nm.

In one embodiment, the layer of aluminium nitride comprises phases, beside the phase of aluminium nitride (P), being of hexagonal and/or cubic structure, preferably hexagonal structure.

The amount of the phase of aluminium nitride (P) out of total amount aluminium nitride in the aluminium nitride layer is suitably at least 50 vol. %, preferably at least 75, more preferably at least 90 vol. %.

In one embodiment the amount of the phase of aluminium nitride (P) out of total amount aluminium nitride in the aluminium nitride layer is substantially 100 vol. %.

The layer of aluminium nitride suitably has a Vickers hardness of ≥2700 HV, preferably ≥2800 HV.

The layer of aluminium nitride suitably has a Vickers hardness of 2700-3300 HV, or 2800-3200 HV.

The layer of aluminium nitride suitably has a reduced Young's modulus of 380 GPa, preferably ≥400 GPa.

The layer of aluminium nitride suitably has a Young's modulus of 380-430 GPa, or 400-425 GPa.

The layer of aluminium nitride suitably has a ratio of plastic deformation of ≥42%, preferably ≥44%. A high of ratio of plastic deformation means a more ductile layer, i.e., less brittle, and this is beneficial in a metal cutting operations since it reduces the risk of damage to the coating of the cutting tool.

Values for the thermal conductivity of aluminium nitride in literature vary a lot and values up to 170 W/mK have been reported. The present aluminium nitride layer shows comparatively low values which is beneficial in a metal cutting operation.

The layer of aluminium nitride suitably has a thermal conductivity of from 5 to 50 W/mK, preferably from 15 to 40 W/mK.

For wear resistant coatings on cutting tools a low thermal conductivity is beneficial to keep the thermal load from the cutting process on the tool substrate as low as possible.

In one embodiment, the layer of aluminium nitride contains Ar in an amount of from 0.05 to 10 at %, preferably from 0.1 to 5 at %, most preferably from 0.8 to 2 at %.

The thickness of the aluminium nitride layer is suitably 0.3-20 μm, preferably 0.5-10 μm, most preferably 1-5 μm.

In one embodiment the coating comprises one or more further layers of a metal nitride(s) and/or oxides below or above the aluminium nitride layer. The metal nitride(s) are suitably a nitride/nitrides of one or more metals belonging to group 4 to 6 in the IUPAC periodic table of elements, optionally together with Al and/or Si. Examples of such metal nitride(s) are TiN and (Ti,Al)N. An example of an oxide is aluminium oxide.

The substrate of the coated cutting tool can be of any kind common in the field of cutting tools for metal machining. The substrate is suitably selected from cemented carbide, cermet, cBN, ceramics, PCD and HSS.

In one preferred embodiment, the substrate is cemented carbide.

The coated cutting tool can be a coated cutting insert, such as a coated cutting insert for turning or a coated cutting insert for milling, or a coated cutting insert for drilling, or a coated cutting insert for threading, or a coated cutting insert for parting and grooving. The coated cutting tool can also be a coated solid tool such as a solid drill, an endmill, or a tap.

The aluminium nitride layer is suitably deposited by High Power Impulse Magnetron Sputtering (HIPIMS).

Thus, it is hereby further provided a method of producing a coated cutting tool as herein disclosed, comprising providing a substrate and depositing in HIPIMS mode a layer of aluminium nitride, at a peak power density of >0.2 kW/cm², preferably >0.4 kW/cm², most preferably >0.7 kW/cm², at a peak current density of >0.2 A/cm², preferably >0.3 A/cm², most preferably >0.4 A/cm², and maximum peak voltage of from ≥1000 V.

The maximum peak voltage is suitably 1000-3000 V, preferably 1500-2500 V.

The substrate temperature during the magnetron sputtering is suitably from 350 to 600° C., or from 400 to 500° C.

The DC bias voltage used in the HIPIMS process is suitably 20-150 V, preferably 30-100 V.

The average power density in the HIPIMS process is suitably 20-100 W·cm$^{-2}$, preferably 30-75 W·cm$^{-2}$.

The pulse length used in the HIPIMS process is suitably from 2 μs to 200 ms, preferably from 10 μs to 100 ms, more preferably from 20 μs to 20 ms, most preferably from 40 μs to 1 ms.

Methods

XRD-Phase Analysis:

The X-ray diffraction patterns concerning the phase analysis were acquired by Grazing incidence mode (GIXRD) on a diffractometer from Panalytical (Empyrean). CuKalpha-radiation with line focus was used for the analysis (high tension 40 kV, current 40 mA). The incident beam was defined by a 2 mm mask and a ⅛° divergence slit in addition with a X-ray mirror producing a parallel X-ray beam. The sideways divergence was controlled by a Soller slit (0.04°). For the diffracted beam path a 0.18° parallel plate collimator in conjunction with a proportional counter (OD-detector) was used. The measurement was done in grazing incidence mode (Omega=1°). The 2Theta range was about 28-45° with a step size of 0.03° and a counting time of 10 s. For the XRD-line-profile analysis a reference measurement (with LaB6-powder) was done with the same parameters as listed above to correct for the instrumental broadening.

The lattice plane spacing (d) is calculated from the peak position of a reflection using Bragg's Law, nλ=2d sin θ, which is:

$$\text{Order of reflection}(n) \times \text{Wavelength}(\lambda) = 2 \times \text{Lattice plane spacing}(d) \times \text{Sin } \theta,$$

where θ is given from the peak position (2Theta[θ]) in XRD, λ is given from the X-ray wavelength 1.5406 Å (for Cu) used and n=1 herein.

From the Williamson-Hall equation using the XRD profile data (peak width), the average domain size of a phase in a coating can be calculated.

XRD-Texture Analysis

For the analysis of the texture in the coating a (Chi-Scan) a diffractometer from Seifert/GE (PTS 3003) was used. CuK$_{alpha}$-radiation with a polycapillary lens (for producing a parallel beam) was applied for the analysis (high tension 40 kV, current 40 mA). The incident beam was defined by a 2 mm pinhole. For the diffracted beam path an energy dispersive detector (Meteor OD) was used. The measurement was done by tilting the Chi-axis from −89-89° with a step size of 1° and a counting time of 30 s.

TEM-Analysis

The Transmission Electron Microscopy data (selected area diffraction patterns and dark field images) was acquired by a Transmission Electron Microscope from FEI (FEI TITAN 80-300). For the analysis, a high tension of 300 kV was used.

When reference is made herein to electron diffraction experiments these are TEM measurements which were carried out with parallel illumination. The area of interest was selected with a selected area aperture.

For TEM sample preparation a FIB (Focused Ion Beam) Lift out was used. For the final polishing the Ga-Ion beam was adjusted to a current of 200 pA at 5 kV.

A cross-section of the coating was analysed perpendicular to surface of the coating.

FIB-SEM Analysis

For the FIB-cross sections a FIB-SEM Crossbeam 540 (manufacturer Zeiss) was used. For the cross section the following parameters were applied (after Pt-deposition): coarse cutting 30 kV 30 nA; fine cutting 30 kV 3 nA; polishing: 30 kV 700 pA. The SEM-images were acquired by SE2- and InLens-detector with 5 kV high voltage and an electron beam current of 300 pA.

Vickers Hardness:

The Vickers hardness was measured by means of nano indentation (load-depth graph) using a Picodentor HM500 of Helmut Fischer GmbH, Sindelfingen, Germany. For the measurement and calculation the Oliver and Pharr evaluation algorithm was applied, wherein a diamond test body according to Vickers was pressed into the layer and the force-path curve was recorded during the measurement. The maximum load used was 15 mN (HV 0.0015), the time period for load increase and load decrease was 20 seconds each and the holding time (creep time) was 10 seconds. From this curve hardness was calculated.

Reduced Young's Modulus

The reduced Young's modulus (reduced modulus of elasticity) was determined by means of nano-indentation (load-depth graph) as described for determining the Vickers hardness.

Ratio of Plastic Deformation:

The numbers were estimated from the load indentation curve obtained as described for determining Vickers hardness. The area enclosed from the loading and unloading curve corresponds to the plastic deformation energy. The area under the loading curve gives plastic and elastic deformation energy. Then one can calculate the amount of plastic deformation energy.

Thermal Conductivity:

The Time-Domain-Thermal Reflectance (TDTR)-Method was used which has the following characteristics:

1. A laser pulse (Pump) is used to heat the sample locally.
2. Depending on the thermal conductivity and heat capacity, the heat energy is transferred from the sample surface towards the substrate. The temperature on the surface decreases by time.
3. The part of the laser being reflected depends on the surface temperature. A second laser pulse (probe pulse) is used for measuring the temperature decrease on the surface.
4. By using a mathematical model the thermal conductivity can be calculated. Reference is made to (D. G. Cahill, Rev. Sci. Instr. 75, 5119 (2004)).

Thickness:

The thickness of the coating layers was determined by calotte grinding. Thereby a steel ball was used having a diameter of 30 mm for grinding the dome shaped recess and further the ring diameters were measured, and the layer thicknesses were calculated therefrom. Measurements of the layer thickness on the rake face (RF) of the cutting tool were carried out at a distance of 2000 μm from the corner, and measurements on the flank face (FF) were carried out in the middle of the flank face.

EXAMPLES

Example 1 (Invention)

An aluminium nitride film was deposited onto a WC—Co based substrate of a mirrow polished insert using HIPIMS mode in a HTC1000 Hauzer equipment.

The substrate had a composition of 10 wt % Co, and balance WC. The geometry of the cutting insert was S15

| | |
|---|---|
| Average power: | 20 kW |
| Pulse power: | 1.14 MW |
| Max. peak voltage: | 2000 V |
| Pulse current: | 600 A |
| Pulse on time: | 80 µs |
| Frequency: | 800 Hz |
| Temperature: | 450° C. |
| Target size: | 18 × 83 cm |
| Target material: | Al |
| Total pressure: | $5.68 \times 10^{-3}$ mbar |
| Argon flow: | 500 sccm |
| Bias potential: | −80 V (DC) |
| Distance target-substrate: | ca. 20 cm |
| Deposition time: | 3 h |
| Coating thickness: | 1 µm, measured on a 2-fold rotated surface (flank face) parallel to target surface |

Example 2 (Reference)

Another aluminium nitride film was deposited onto a WC—Co based substrate of a mirrow polished insert using HIPIMS mode in a Oerlikon Balzers S3P Ingenia equipment.

The substrate had a composition of 10 wt % Co, and balance WC. The geometry of the cutting insert was S15

| | |
|---|---|
| Average power per source: | 3.3 kW |
| Pulse on time: | 50 ms |
| Pulse current: | 45 A |
| Frequency: | 6 Hz |
| Temperature: | 450° C. |
| Target size: | Ø 142 mm |
| Target material: | Al (Cr-containing edge) |
| Total pressure: | 0.9 Pa |
| Argon flow: | 240 sccm |
| Bias potential: | −100 V (bipolar) |
| Distance target-substrate: | ca. 12 cm |
| Deposition time: | 90 min |
| Coating thickness: | 0.64 µm, measured on a 2-fold rotated surface (flank face) parallel to target surface) |

Grazing incidence XRD (GIXRD) analysis was made on the samples from Examples 1 and 2. The XRD pattern for the inventive coating is shown in FIG. 1 and the XRD pattern for the comparative (hexagonal) reference coating is shown in FIG. 2.

It is seen that the inventive coating shows a broad peak between 35-40 degrees (2theta) while the comparative (hexagonal) reference coating shows a sharp peak within the same interval.

Figure 2:
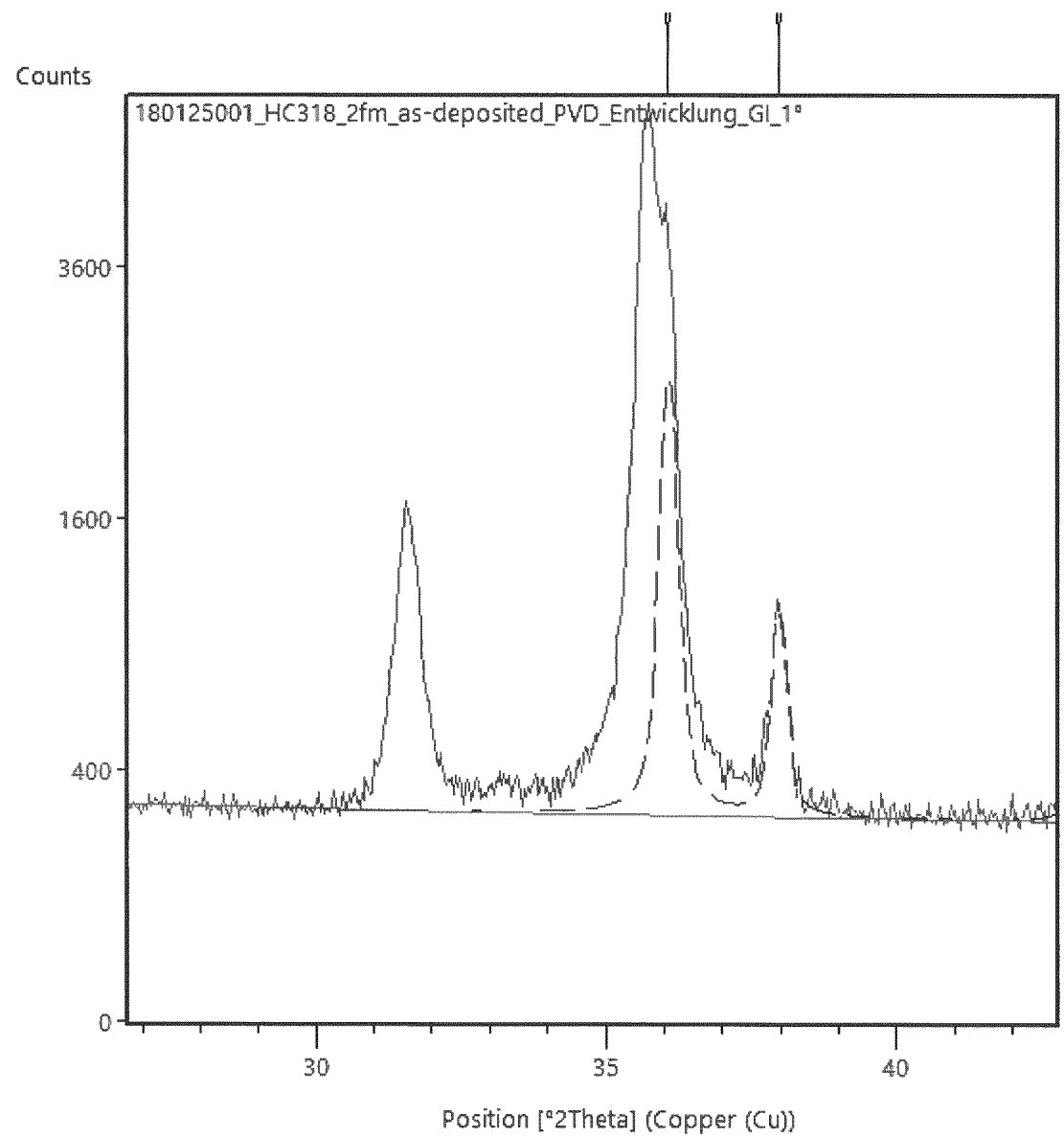
FIG. 2 shows an X-ray 2theta diffractogram for a layer of aluminium nitride having a conventional hexagonal structure.

In FIG. 1 and FIG. 2, respectively, the XRD curve having a solid line is the original diffraction curve with significant signals from WC at around 31.5 degrees and 36 degrees 2theta. However, signals from aluminium nitride are seen as a shoulder in FIGS. 1 and 2 at about 36-37 degrees 2theta. In FIG. 2 there is also a sharp aluminium nitride peak at about 38 degrees 2theta. The dashed line in FIGS. 1 and 2 is the diffraction curve for aluminium nitride extracted from the original diffraction curve by peak profile fitting.

A detailed analysis of the position and width of the diffraction peak seen at 2theta about 37-38° gives data seen in Table 1 for the inventive coating and the reference hexagonal aluminium nitride coating:

TABLE 1

| Sample | Lattice plane spacing (d) [Å] | Correlation length (Domain "size") [Å] |
|---|---|---|
| invention | 2.409 | 36 |
| reference | 2.367 | 667 |

The profile (width) of the XRD peak is affected by the average size of the domains giving a specific diffraction. By using the Williamson-Hall equation the correlation length (which is herein considered to be the same as the average domain size) can be calculated. For the inventive coating it can be seen that the dimension of the domains giving a specific diffraction in the inventive coating is much smaller than such domains in the reference coating.

Due to the wave length of 1.5 Å for the used X-ray, the possibilities for making a more detailed structural analysis from the XRD data is limited. Furthermore, since the crystallite structures are very fine XRD can not be used for determining the angle between lattice planes.

Figure 3:
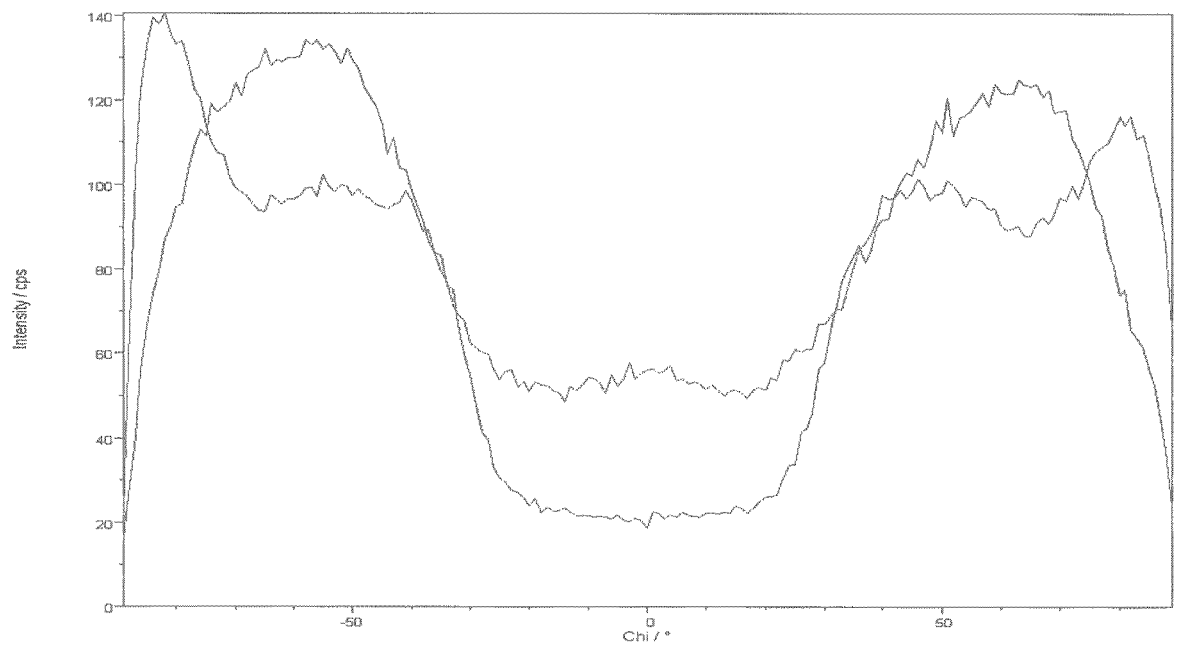
FIG. 3 shows X-ray chi-scans of a layer of aluminium nitride according to the invention and a layer of aluminium nitride having a conventional hexagonal structure.

However from the XRD analysis one can obtain information about the growth direction of the aluminium nitride layer. In FIG. 3 chi scans according to the diffraction signal at about 2.4 Å are shown. For the inventive coating the lattice planes (at about 2.4 Å) are (as an average) less tilted against the normal of the surface compared to the hexagonal reference coating. Further the peaks were fitted using Gaussian profiles. The position of the maximum of the fitted Gaussian profile corresponds to a tilt angle against the perpendicular plane, and the variation of the profile corresponds to the full width half maximum (FWHM) of the peak.

Figure 4:
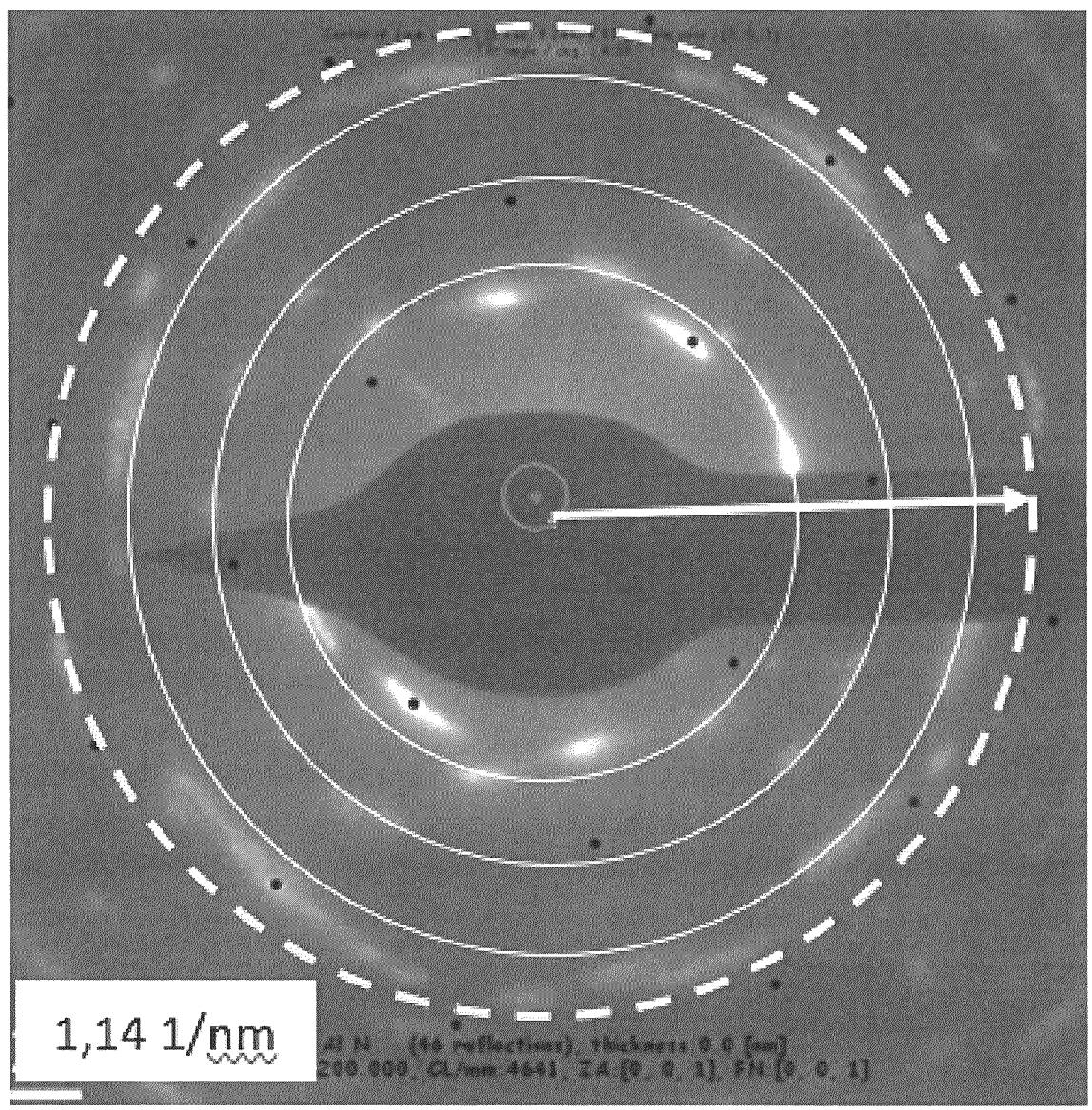
FIG. 4 shows an electron diffraction image of the phase of aluminium nitride (P) in which the cubic aluminium nitride diffraction pattern is marked as black spots.
Figure 5:
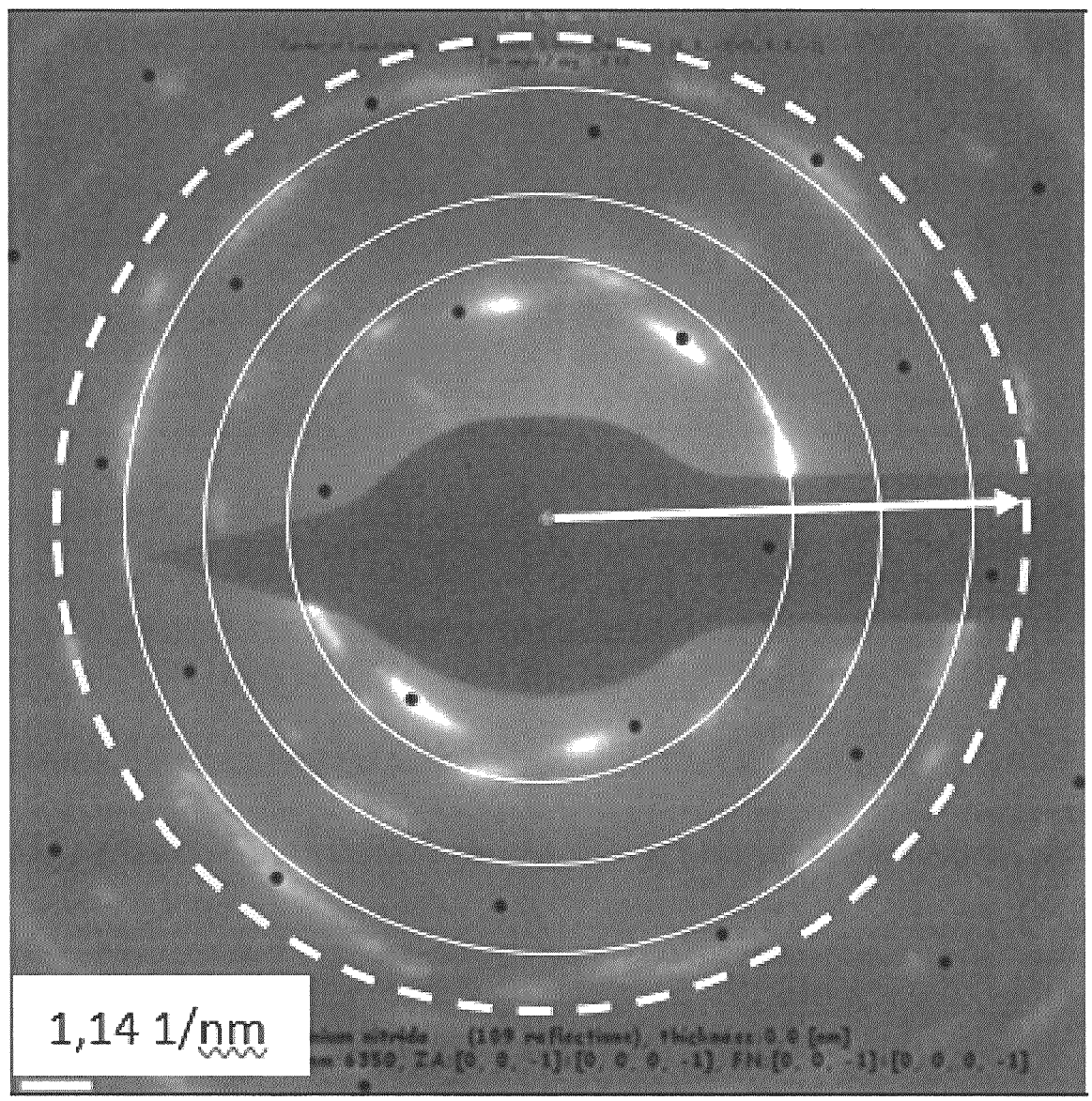
FIG. 5 shows an electron diffraction image of the phase of aluminium nitride (P) in which the hexagonal aluminium nitride diffraction pattern is marked as black spots.
Figure 6:
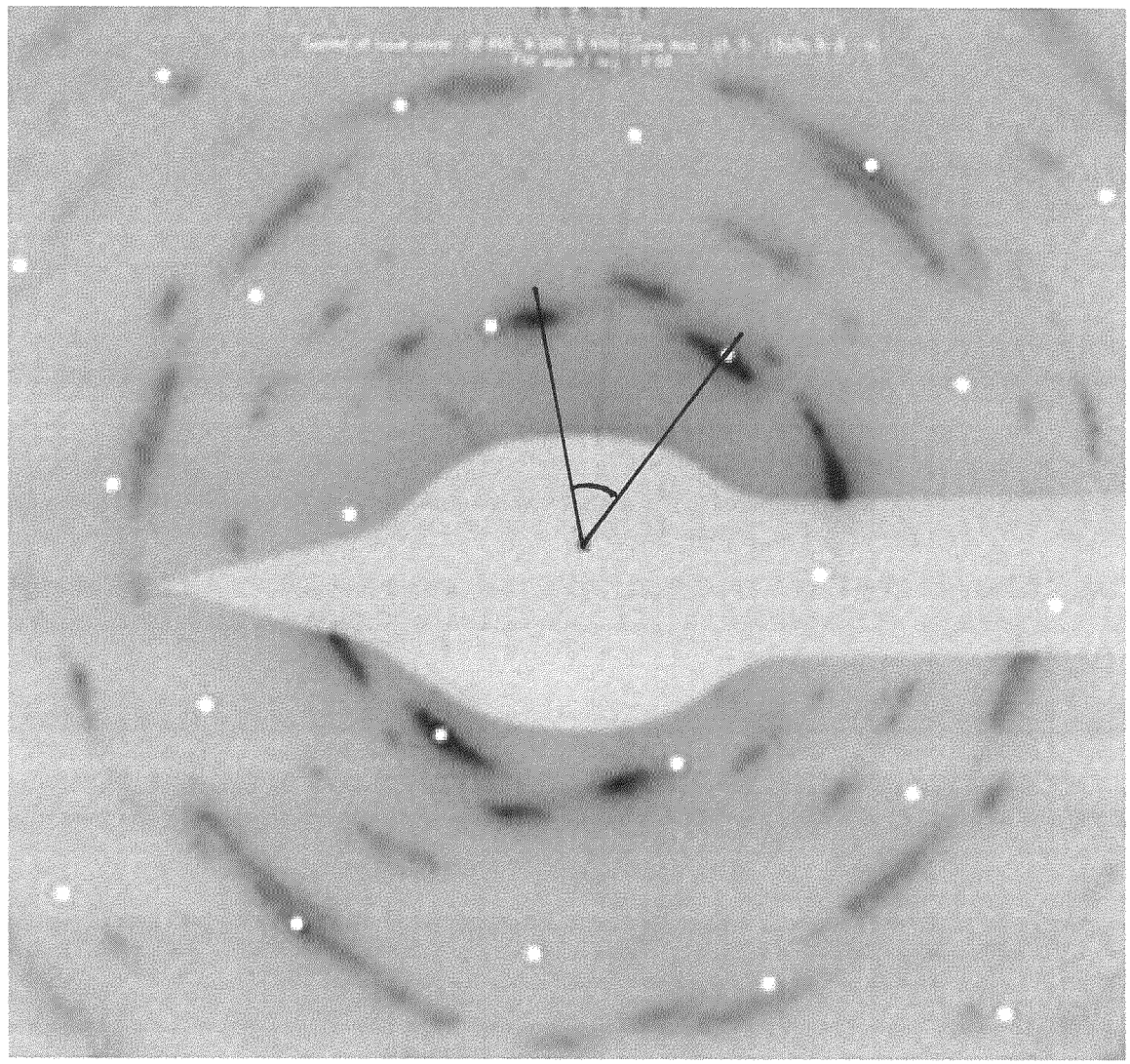
FIG. 6 shows an electron diffraction image of the phase of aluminium nitride (P) in which an angle is shown between the innermost diffraction spots. The hexagonal aluminium nitride diffraction pattern is marked as white spots.

Electron diffraction analysis was furthermore made on the samples. FIGS. 4-6 show the same electron diffraction pattern obtained from the inventive coating. The black dots included in FIG. 4 correspond with the cubic pattern (from literature) and the black dots in FIG. 5 correspond to the hexagonal pattern (from literature).

For the evaluation of the experimental data scattering vectors are used up to $q=8.16$ nm$^{-1}$. This vector is shown in the diffractogram as a dotted ring in FIGS. 4 and 5. One sees that in the electron diffraction image there is no perfect match between the measured diffraction pattern of the coating and the theoretical diffraction patterns for cubic AlN and hexagonal AlN (black dots in FIGS. 4 and 5 respectively). For cubic and hexagonal crystals they each have a number of specific reflections originating from lattice planes in their structures but for the inventive coating some of these reflections are missing. The conclusion is therefore that the crystal symmetry of the inventive coating is neither cubic nor hexagonal.

From the electron diffraction pattern it is seen that reflections from at least three d-spacings are present (see solid rings in FIGS. 4 and 5) which are not matching any d-spacing in the cubic or hexagonal structure.

In FIG. 6 the angle between the innermost diffraction spots is marked and measured to be 48 degrees.

It was not possible to index the diffraction pattern obtained for the phase of aluminium nitride (P) fitting the diffraction pattern of cubic or hexagonal aluminium nitride by even if using a distorted unit cell (angle variation±5°; variation in cell parameter±1 Å). The conclusion is that the phase of aluminium nitride (P) is not a distorted cubic or hexagonal structure but a unique structure on its own.

Figure 7:
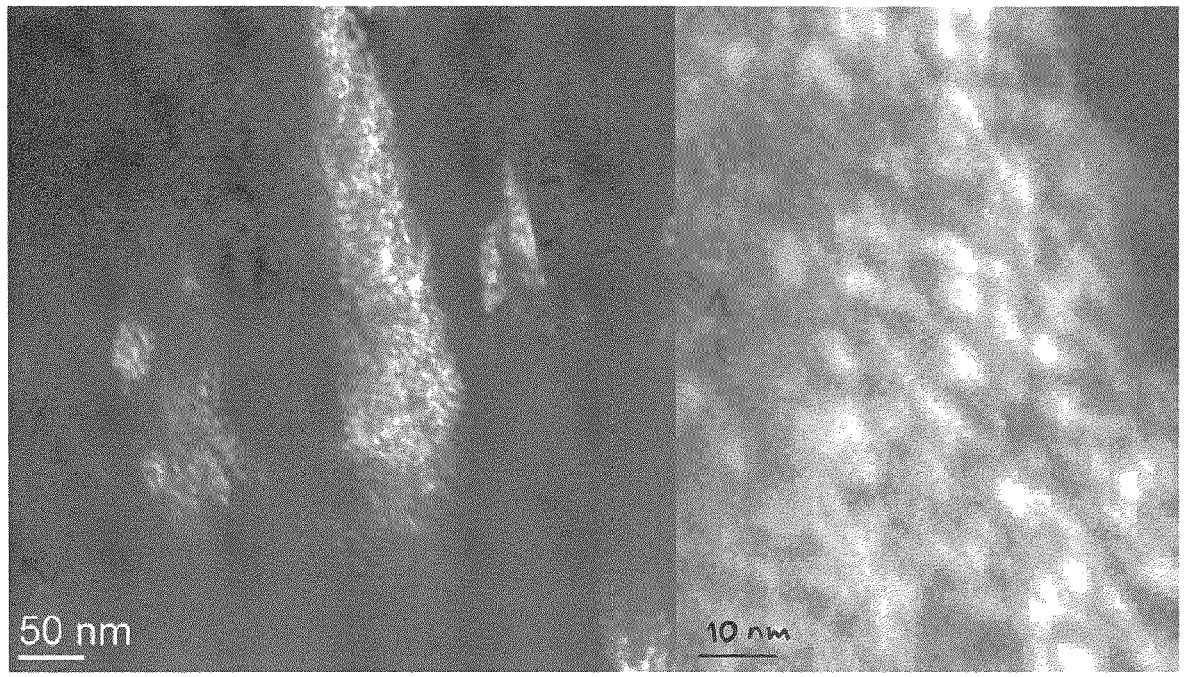
FIG. 7 shows a dark-field TEM image of a layer of aluminium nitride according to the invention.

By using scanning electron microscopy (SEM) crystallite sizes in the µm range can be detected. However, TEM DF images show the presence of substructures in the form of areas, contributing coherently to a diffraction signal are each from about 10 nm up to about several hundreds of nm in size, the average being about 50-200 nm. Smaller domain structures having the same crystal orientation are furthermore seen within such an area and their size is in the range of 2-10 nm. The distance between these domain structures having the same crystal orientation seems to be in the same range, i.e., 2-10 nm. An example of a dark field TEM image of the aluminium nitride layer according to the invention is seen in FIG. 7.

Hardness measurements (load 15 mN) were carried out on the flank face of the coated tool to determine Vickers hardness, reduced Young modulus (EIT) and ratio of plastic deformation (n pl). Table 2 shows the results. For characterization of toughness (Young's modulus) of the coatings Vickers indents with a load of 500 mN were carried out and cross section prepared.

TABLE 2

| Coating | Hardness HV [Vickers] | EIT [GPa] | n pl [%] |
|---|---|---|---|
| invention | 2831 | 409 | 44.4 |
| reference (hexagonal) | 2262 | 318 | 36.6 |

Figure 8:
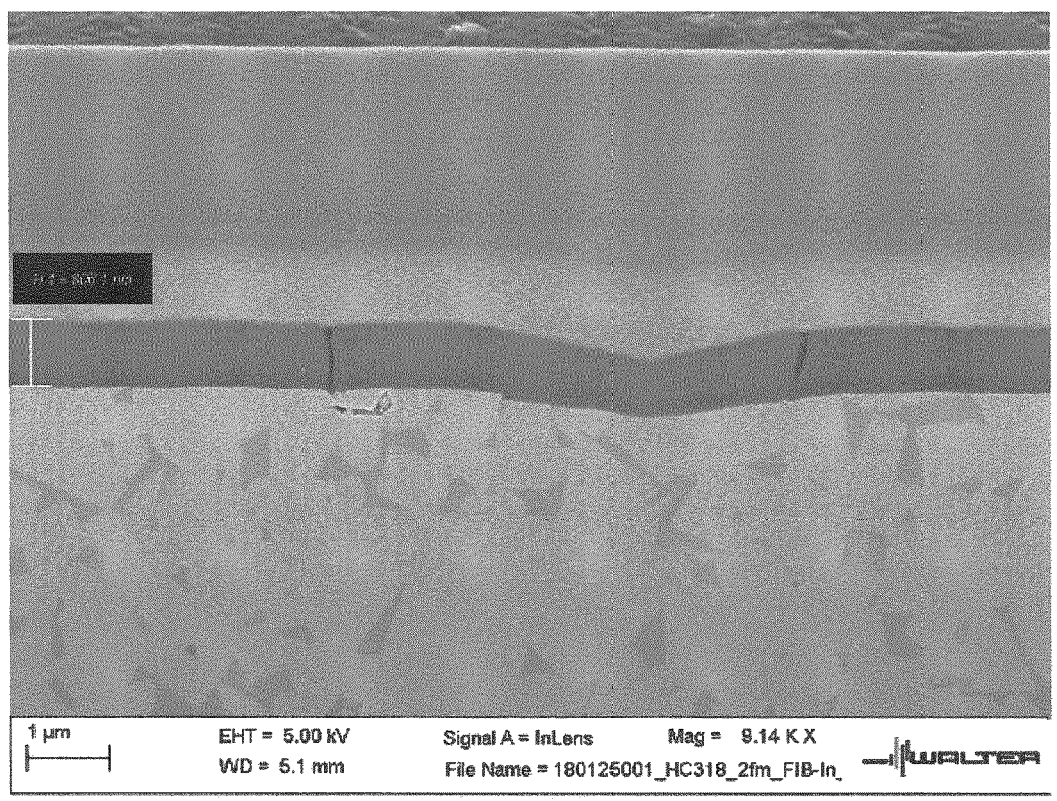
FIG. 8 shows crack propagation for a reference hexagonal aluminium nitride coating.
Figure 9:
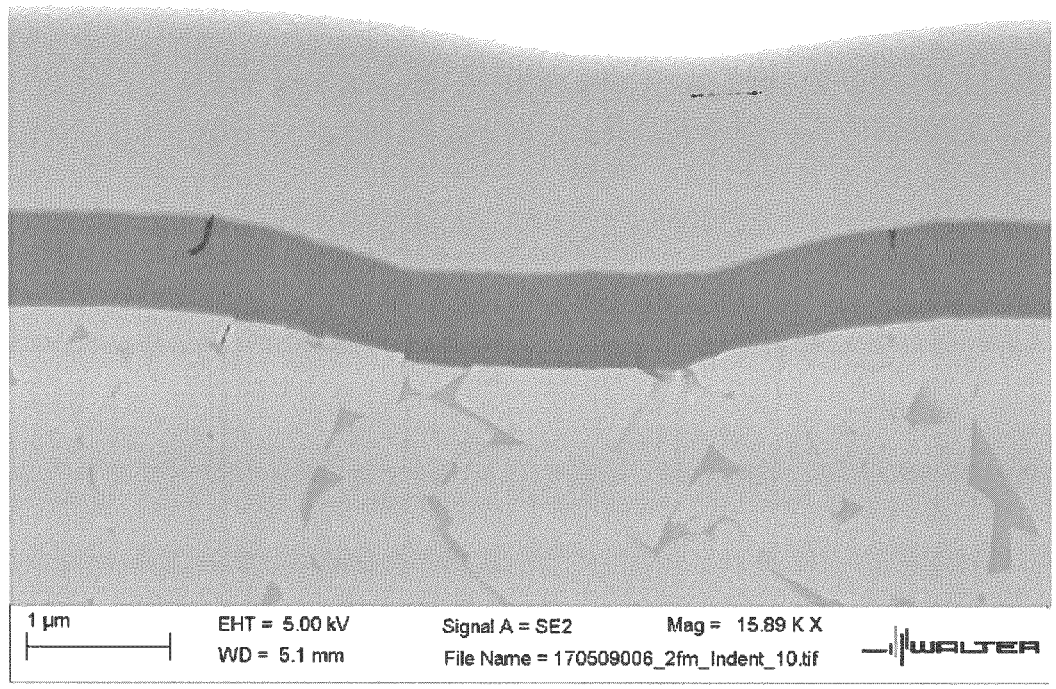
FIG. 9 shows crack propagation for an aluminium nitride coating according to the invention.

From SEM pictures it could be concluded that crack propagation for the reference coating of hexagonal aluminium nitride was characterised by straight cracks going directly down through the coating to the substrate. The crack progagation for a coating according to the invention was characterised by cracks not reaching the substrate and also deviating. See FIG. 8 for the resulting crack status for the reference hexagonal coating and FIG. 9 for the coating according to the invention.

Finally, for the coating according to the invention the thermal conductivity was determined to be in the range of 26±3 W/mK.

The invention claimed is:

1. A coated cutting tool comprising a substrate with a coating including a layer of aluminium nitride having a phase of aluminium nitride (P), the phase of aluminium nitride (P) having an electron diffraction pattern, wherein up to a scattering vector of $q=8.16$ nm$^{-1}$ there is at least one additional reflection (R) to any reflection found in the cubic and hexagonal aluminium nitride diffraction patterns.

2. The coated cutting tool according to claim 1, wherein one additional reflection (R) originates from a lattice plane spacing of between 2.2 and 2.6 Å.

3. The coated cutting tool according to claim 1, wherein one additional reflection (R) originates from a lattice plane spacing of between 1.7 and 1.9 Å.

4. The coated cutting tool according to claim 1, wherein one additional reflection (R) originates from a lattice plane spacing of between 1.3 and 1.5 Å.

5. The coated cutting tool according to claim 1, wherein in the phase of aluminium nitride (P) there are lattice planes of the same lattice plane spacing having an angle between each other of between 40 and 58 degrees.

6. The coating cutting tool according to claim 5, wherein one lattice plane spacing corresponds to innermost spots in the electron diffraction pattern.

7. The coated cutting tool according to claim 1, wherein a lattice plane spacing 1.56 Å of hexagonal aluminium nitride (110 orientation, pdf-Nr. 00-025-1133) is missing in the phase of aluminium nitride (P) and/or a lattice plane spacing 2.02 Å of cubic aluminium nitride (200 orientation, pdf-Nr. 00-046-1200) is missing in the phase of aluminium nitride (P).

8. The coated cutting tool according to claim 1, wherein the phase of aluminium nitride (P) has a lattice plane spacing of between 2.380 and 2.430 Å.

9. The coated cutting tool according to claim 8, wherein the phase of aluminium nitride (P) has a preferred orientation of the lattice plane spacing of between 2.380 to 2.430 Å being tilted 50-70° against the surface normal.

10. The coated cutting tool according to claim 1, wherein the phase of aluminium nitride (P) is present in a form of domains in the layer of aluminium nitride, a mean size of the domains being less than or equal to 100 Å.

11. The coated cutting tool according to claim 1, wherein the layer of aluminium nitride has a Vickers hardness of ≥2700 HV.

12. The coated cutting tool according to claim 1, wherein the layer of aluminium nitride has a reduced Young's modulus of ≥380 GPa.

13. The coated cutting tool according to claim 1, wherein the layer of aluminium nitride has a ratio of plastic deformation of ≥42%.

14. The coated cutting tool according to claim 1, wherein a thickness of the aluminium nitride layer is 0.5-10 μm.

15. The coated cutting tool according to claim 1, wherein the substrate is selected from cemented carbide, cermet, cBN, ceramics, PCD and HSS.

16. A method of producing a coated cutting tool according to claim 1, the method comprising the steps of:
providing a substrate; and
depositing in HIPIMS mode a layer of aluminium nitride on the substrate at a peak power density of >0.2 kW/cm$^2$, at a peak current density of >0.2 A/cm$^2$, and a maximum peak voltage of from ≥1000 V.

* * * * *